US006593560B2

(12) United States Patent
Misek

(10) Patent No.: US 6,593,560 B2
(45) Date of Patent: Jul. 15, 2003

(54) PHOTODETECTOR CIRCUIT WITH VOLTAGE OUTPUT

(75) Inventor: Brian J. Misek, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 314 days.

(21) Appl. No.: 09/811,125

(22) Filed: Mar. 16, 2001

(65) Prior Publication Data

US 2003/0038230 A1 Feb. 27, 2003

(51) Int. Cl.[7] .............................................. H01L 27/00
(52) U.S. Cl. ................... 250/208.1; 250/214 R
(58) Field of Search ...................... 250/208.1, 214 R, 250/214 LA; 348/304–311, 241; 257/290, 291

(56) References Cited

U.S. PATENT DOCUMENTS

| 5,769,384 A | 6/1998 | Baumgartner et al. ...... 250/214 |
| 6,037,643 A | 3/2000 | Knee ........................... 257/443 |
| 6,380,530 B1 * | 4/2002 | Afghahi ................... 250/208.1 |

* cited by examiner

Primary Examiner—Que T. Le

(57) ABSTRACT

A photoelement for an image sensor is described which does not require a charge-to-voltage conversion, but instead outputs a voltage directly related to the intensity of the light impinging on the photoelement. In one embodiment, only parasitic capacitance is used for the integrating function. A transistor connected in a source follower configuration couples the parasitic capacitance to a read transistor. The source follower shields the integrating capacitance from any other parasitic capacitances not intended to be part of the integrating capacitance, thus making the output of the photoelement highly accurate with high gain.

20 Claims, 2 Drawing Sheets

PHOTODETECTOR CIRCUIT WITH VOLTAGE OUTPUT

FIELD OF THE INVENTION

This invention relates to image sensors for converting an optical image into electrical signals and, in particular, to a pixel element in such a sensor.

BACKGROUND

One common type of image sensor, commonly found in digital and video cameras, includes an array of photoelements, where each photoelement generates a signal approximately proportional to the light impinging upon the photoelement area. As shown in FIG. 1, such a photoelement array 10 outputs its signals, typically pursuant to an addressing operation, to an analog-to-digital converter 12 to produce digital signals. Processing circuitry 14 then performs the required processing of the digital data to, for example, display the image on a screen or store the image in a memory.

FIG. 2 illustrates one photoelement 20 (or pixel element) in the photoelement array 10 and serves to illustrate a common drawback of photoelements. The circuit of FIG. 1 is described in detail in U.S. Pat. No. 6,037,643, assigned to Hewlett-Packard Company and Agilent Technologies. A similar circuit is described in U.S. Pat. No. 5,769,384, also assigned to Hewlett-Packard Company and Agilent Technologies.

Typically photoelements, such as shown in FIG. 2, generate a charge on an integrating capacitor 22 proportional to the light impinging upon the photoelement and the time the shutter is open (i.e., the integration time). The charge is converted to a voltage outside of the photoelement during a reading cycle. The voltage output is then applied to an analog-to-digital converter, as shown in FIG. 1.

In FIG. 2, a bias current is set up by a bias signal PBB controlling a transistor 24. Transistors 26 and 28 form a bias point amplifier for setting the base bias of a phototransistor 30 at a fixed level with respect to its emitter. Transistors 26 and 28 operate as a negative feedback loop, wherein an increased emitter voltage pulls up the gate of transistor 26, which causes transistor 28, connected as a source follower, to lower the emitter voltage. Transistor 28 also provides isolation of the phototransistor 30 emitter from fluctuations at node 32.

In operation, the integrating capacitor 22 is assumed to be initially charged to a reset voltage by coupling the capacitor to the summing node of the transfer amplifier 44 while read transistor 36 is on. A shutter signal is high during the initial charging of capacitor 22 so that the shutter transistor 38 is off and transistor 40 is on. Transistor 40, when on, provides a path for phototransistor 30 to draw current from the power supply.

When the shutter signal goes low, transistor 40 is turned off and transistor 38 is turned on, discharging capacitor 22 through phototransistor 30 at a rate depending on the light impinging on the base of phototransistor 30. At the end of the shutter period (e.g., 20 microseconds), the shutter signal goes high, decoupling phototransistor 30 from capacitor 22. Since the rate of discharge of capacitor 22 during the shutter period is approximately proportional to the light incident upon the phototransistor 30, the charge on capacitor 22 after the shutter is closed now reflects the integral of the light intensity during the time that the shutter was open.

A read signal NRD then goes low to couple capacitor 22 to an output line 34 and to the input of a transfer amplifier 44. Transfer amplifier 44 converts the charge on capacitor 22 to a voltage signal. The transfer amplifier 44 pulls the output line 34 up to Vref (basically a reset level of capacitor 22), resulting in the charge that was removed from capacitor 22 by the light-induced current during the shutter open time being transferred to a transfer capacitor 48. The read signal is now raised to turn off transistor 36.

The output of the transfer amplifier 44 now corresponds to the amount of light that impinged on phototransistor 30 while the shutter was open. This voltage is processed as shown in FIG. 1 for that particular pixel position. The output line 34 may be connected to all pixel elements in a column, where only one row of photoelements is addressed at a time by the NRD line being common to a row of pixels.

One problem with such image sensors that convert a charge on an integrating capacitor internal to the pixel area to a voltage outside the pixel area is that the transfer capacitor 48 and integrating capacitor 22 must be fairly large to prevent the capacitors' signals from being significantly distorted by stray capacitances that are coupled to the transfer capacitor 48, the integrating capacitor 22, or any of the interconnects between the two when the read transistor 36 is turned on. Further, the additional charge-to-voltage conversion circuitry takes up chip area.

Accordingly, the design of the pixel element is relatively inflexible, and its sensitivity (ability to produce large signals in low light conditions) is limited due to the required size of the transfer capacitor 48. The size of the transfer capacitor 48 has an inverse relationship to both the settling time of the transfer amplifier 44 and the substrate noise coupling into the signal. This means that as the transfer capacitor is made smaller to increase the sensitivity of the photodetector, the settling time and noise get worse.

What is needed is a photoelement that does not suffer from the drawbacks of the prior art.

SUMMARY

A photoelement (or pixel element) for an image sensor is described that does not require a charge-to-voltage conversion, but instead outputs a voltage directly related to the intensity of the light impinging on the photoelement. Hence, a relatively large integrating capacitor is not needed. In one embodiment, only parasitic capacitance is used for the integrating function. Additional capacitance may be added to control the gain of the photoelement.

The integrating capacitance is initially charged to a reset voltage. A shutter signal closes a switch that couples the capacitance to a phototransistor or photodiode to discharge the capacitance. The switch is opened after the shutter period so that the remaining charge corresponds to the integral of the light that impinged on the photoelement during the shutter period.

An MOS transistor, connected in a source follower configuration, has its gate connected to the integrating capacitance and its source coupled to an MOS read transistor. The read transistor is also connected to an output pin of the photoelement. When the read transistor is turned on, the voltage at the source of the source follower is applied to the output pin. There is no external charge-to-voltage transfer circuitry used.

The source follower shields the integrating capacitance from any other parasitic capacitances not intended to be part of the integrating capacitance, thus making the output of the photoelement highly accurate with high gain.

DETAILED DESCRIPTION

Figure 3:
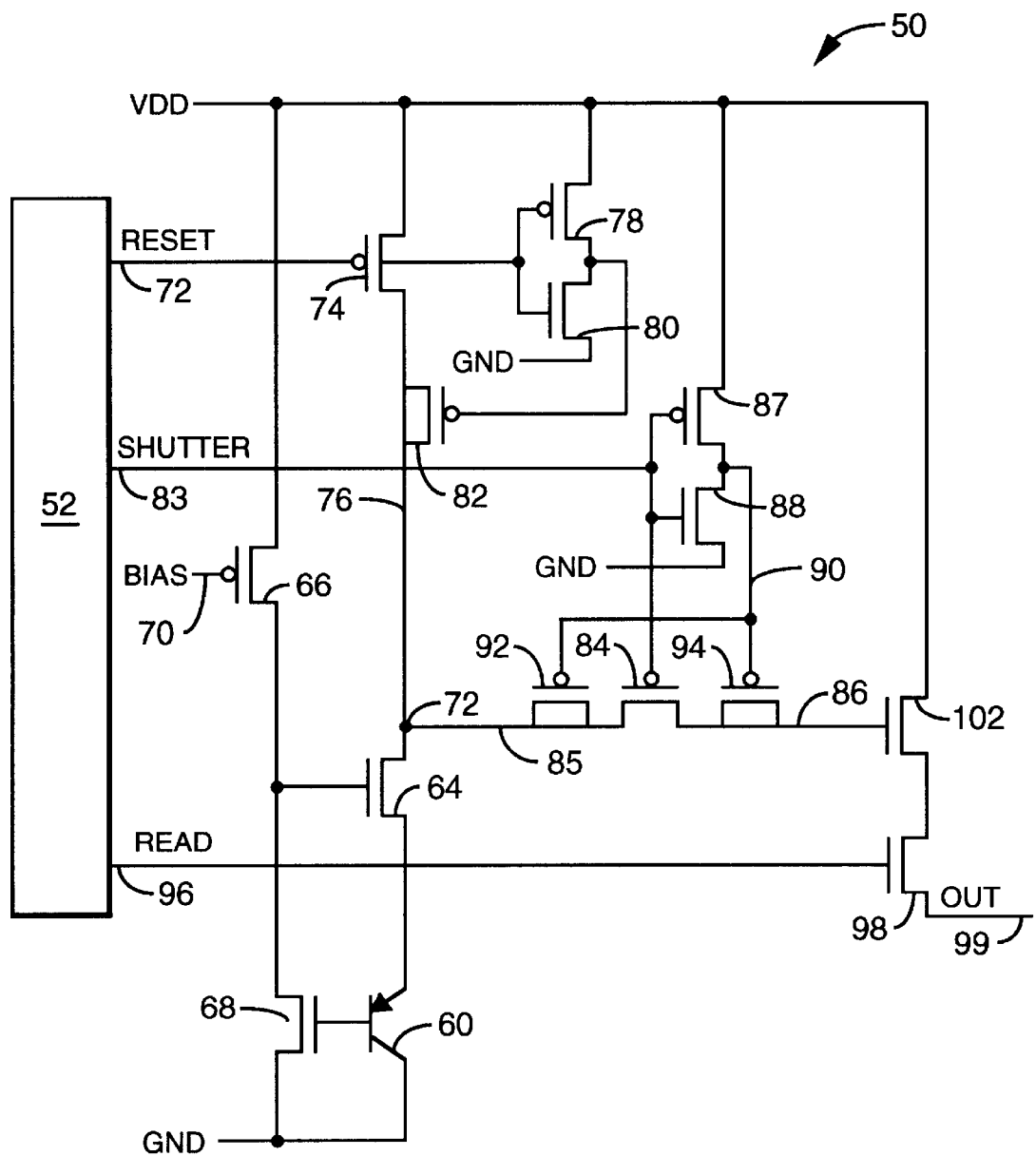
FIG. 3 is a circuit in accordance with one embodiment of the invention.

FIG. 3 illustrates a single photoelement 50 in an image sensor array of photoelements. A controller 52 (outside of the photoelement) controls the various signals, such as shutter, read, and reset, to the various photoelements in the array in a conventional manner, and such detail need not be supplied. The photoelements are typically arranged in a two dimensional array, and the elements are addressed by row and column in a typical application.

Figure 2:
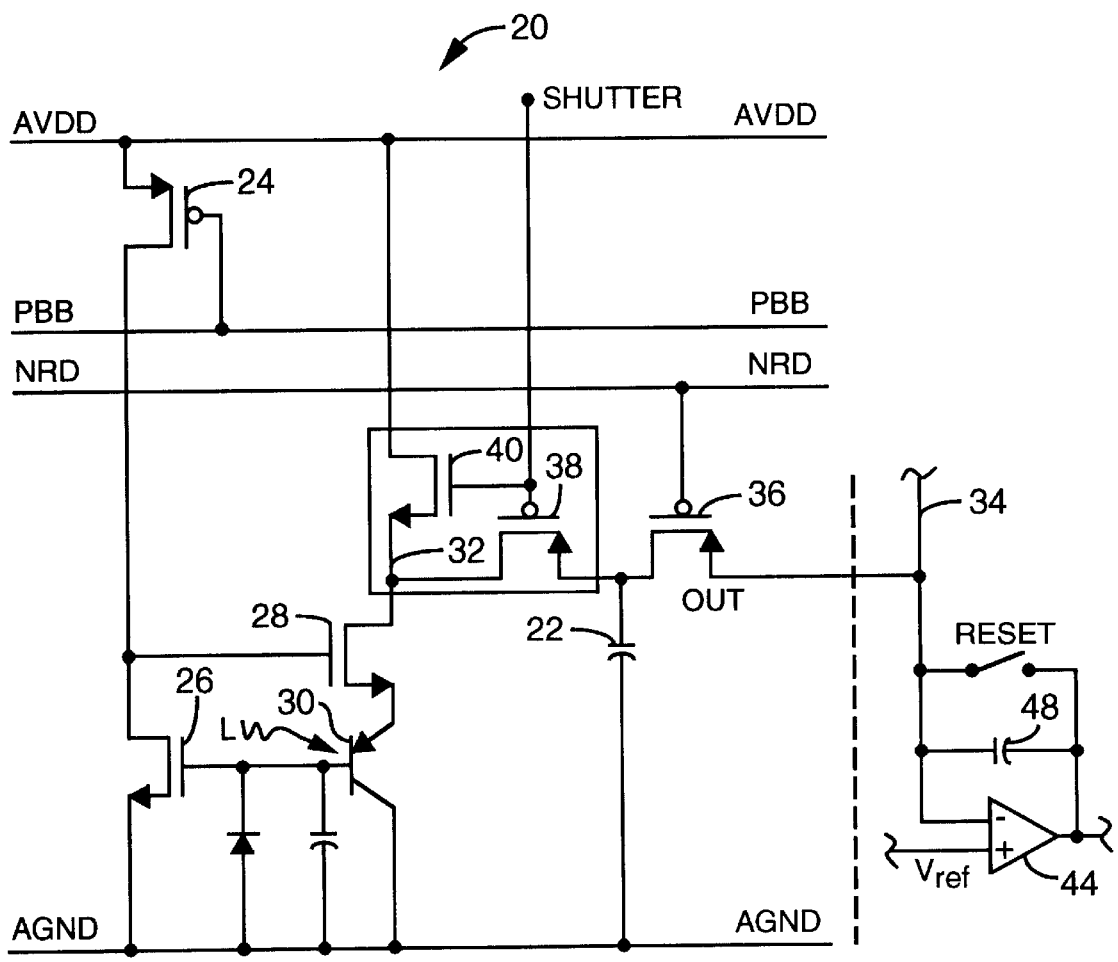
FIG. 2 is one type of pixel element circuit using a charge-to-voltage converter.

A phototransistor 60 and biasing network comprising transistors 64, 66, and 68 may be similar to those shown in FIG. 2. A bias signal is applied to pin 70, which sets up a bias condition between transistors 64, 66 and 68 to maintain a stable base-to-collector voltage across phototransistor 60. Transistor 64 also provides shielding of node 72 from phototransistor 60.

Likewise, a photodiode could be used in place of the phototransistor with the cathode of the diode connected to the source of transistor 64 and its anode connected to ground. Transistor 64 acts as a buffering device so the voltage on the reversed bias capacitance of the diode does not change when the voltage on line 85 changes. If the cathode voltage were allowed to change, the change would result in stealing signal charge away from the generated signal current.

In operation, a low reset pulse on pin 72 turns on transistor 74 to couple the power supply voltage VDD to line 76. The low reset pulse is also applied to an inverter formed by transistors 78 and 80 so as to invert the reset signal. This inverted reset signal is applied to a gate of PMOS transistor 82, which acts as a charge compensator to absorb the charge spike generated by later switching off transistor 74. The source and drain of transistor 82 are shorted together.

During this initial charging time, a shutter signal applied to pin 83 is low, causing the PMOS shutter transistor 84 to be on. Shutter transistor 84 couples line 85 to line 86. Thus, VDD charges the parasitic capacitance on lines 76, 85 and 86 during the reset period.

The shutter signal is also inverted by transistors 87 and 88 so as to generate an inverted reset signal on line 90. This inverted reset signal is coupled the gates of PMOS transistors 92 and 94, which act as charge compensators to absorb the charge spike generated when shutter transistor 84 is later turned off.

Figure 1:
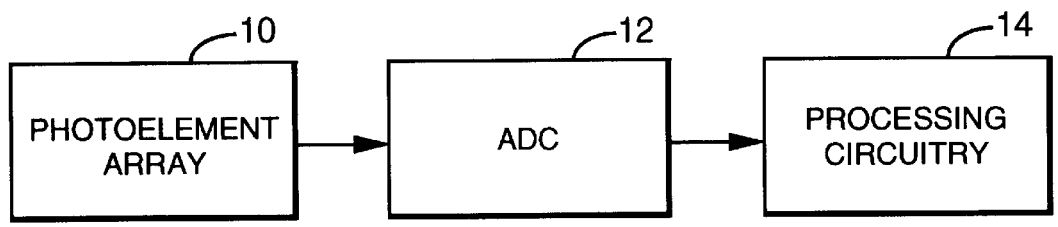
FIG. 1 shows functional blocks of a conventional image sensor circuit.

Also at this time, a read signal applied to read pin 96 is made high to turn on the NMOS read transistor 98. The output voltage at pin 99 is then sampled, such as by the analog-to-digital converter (ADC) 12 in FIG. 1 or a capacitor in the sampling circuit of the ADC, to provide a baseline voltage.

The read signal is then pulled low to shut off read transistor 98.

To detect the amount of light impinging on the photoelement 50, a high signal is applied to reset pin 72 to turn off transistor 74 and isolate line 76 from VDD. The low shutter signal remains applied to pin 83. Phototransistor 60, which draws a current proportional to the intensity of light impinging upon the base of phototransistor 60, discharges the initial charge on lines 76, 85, and 86 during this time.

After a small (e.g., 20 microsecond) shutter period, the shutter signal is then raised to shut off transistor 84, isolating line 86 from the phototransistor 60. As mentioned above, transistors 92 and 94 absorb any charge spike when shutter transistor 84 is turned off. Transistors 92 and 94, acting as charge compensators, are particularly needed when using very small integrating capacitors to avoid large voltage offsets. Also at this time, the reset signal at pin 72 is driven low to connect VDD to line 76 to provide a source for the current through phototransistor 60 and prevent lines 76 and 85 from being pulled low.

The remaining charge on line 86 is thus related to the intensity of light that impinged upon phototransistor 60 during the shutter period. Line 86 is coupled to the gate of an NMOS transistor 102 connected as a source follower between VDD and the read transistor 98. The output pin 99 is coupled to a current source to ground. The charge on line 86 creates a threshold voltage drop across transistor 102 that turns on transistor 102 to a degree so that current flows in transistor 102. Since transistor 102 is connected as a source follower, the source voltage of transistor 102 is one threshold voltage less than its gate voltage and tracks the gate voltage, so that the source voltage corresponds to the light intensity that impinged upon phototransistor 60 during the shutter period. Transistor 102 also buffers line 86 from any output circuit so any external parasitic capacitances do not distort the charge signal on line 86.

A high read signal applied to pin 96 then turns on NMOS read transistor 98 to output a voltage on pin 99 approximately equal to that at the source of transistor 102. The voltage at the output pin 99 (connected to a column line) may be applied to an analog-to-digital converter without any conversion of charge into voltage, in contrast to the circuit of FIG. 2. The difference between the output voltage at reset and the output voltage after integration is used in one embodiment to generate the light information. Using the difference provides offset cancellation and first order cancellation of variations in the source followers that form the output buffer of each pixel.

After the voltage at pin 99 is read by conventional circuitry, typically pursuant to row and column addressing operations, the reset signal and shutter signal are pulled low to charge lines 76, 85, and 86 for a new detection cycle. A voltage other than VDD may be used to charge the lines 76, 85, and 86.

Additional integrating capacitance may be added to line 86 for any reason, such as for gain control. Such capacitance may be provided as parasitic capacitance, FET capacitors, or other types of capacitors.

Numerous advantages result from the disclosed photodetector:

1. a small integrating capacitor can be used, resulting in increased light sensitivity of the pixel and a smaller pixel area;
2. the source follower isolates the integrating capacitor from other circuitry, reducing noise and increasing design freedom;
3. there is no need for a charge-to-voltage converter;
4. decoupling the capacitance of the light sensitive device (e.g., phototransistor 60) from the integrating capacitance by transistor 64 allows the use of either a phototransistor or photodiode as the light gathering device.

It also allows the detector to be made larger to gather more light, but this increase in detector size and detector capacitance does not cause the sensitivity of this circuit to be reduced as it does in prior art sensors.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A photodetector device comprising:
    a photoelement, said photoelement comprising:
        a photosensitive device generating a current related to an amount of light impinging on said photosensitive device;
        a storage capacitance;
        a reset switch for connecting said storage capacitance to a voltage source for charging said storage capacitance in a charging cycle and for disconnecting said storage capacitance from said voltage source during a discharging cycle;
        a shutter switch for coupling said storage capacitance to said photosensitive device during a discharging cycle and for isolating said storage capacitance during a read cycle;
        a first MOS transistor having a gate connected to said storage capacitance, said first MOS transistor having a first current carrying terminal connected to a first voltage, and having a second current carrying terminal providing a second voltage related to a gate voltage of said first MOS transistor during said read cycle; and
        a read switch connected to first MOS transistor to couple a voltage corresponding to said second voltage to an output terminal so as to output, during said read cycle, a voltage relating to light impinging on said photosensitive device during said discharging cycle.

2. The device of claim 1 wherein said storage capacitance is a parasitic capacitance of a conductive line in said photoelement.

3. The device of claim 1 wherein said storage capacitance includes capacitance of one or more FET capacitors.

4. The device of claim 1 further comprising:
    an inverter for receiving a shutter control signal; and
    a second MOS transistor coupled to receive an inverted shutter control signal and coupled to said storage capacitance for mitigating voltage spikes when said shutter switch is switched.

5. The device of claim 1 further comprising a bias network coupled to said photosensitive device for establishing a bias signal.

6. The device of claim 5 wherein said bias network comprises:
    a second MOS transistor connected to said voltage source for generating a current;
    a third MOS transistor connected between said second MOS transistor and a reference potential, said third MOS transistor having a gate coupled to said photosensitive device; and
    a fourth MOS transistor having first terminal connected to said reset switch, a second terminal connected to said photosensitive device, and a gate connected to a terminal of said second MOS transistor.

7. The device of claim 6 wherein said photosensitive device is a phototransistor, wherein said gate of said third MOS transistor is coupled to a base of said phototransistor, and wherein said second terminal of said fourth MOS transistor is coupled to an emitter of said phototransistor.

8. The device of claim 1 wherein said photosensitive device is a phototransistor.

9. The device of claim 1 further comprising a second MOS transistor connected between said storage capacitance and said photosensitive device, said second MOS transistor providing buffering between said photosensitive device and said storage capacitance.

10. The device of claim 1 wherein said reset switch is a PMOS transistor.

11. The device of claim 1 wherein said shutter switch is a PMOS transistor.

12. The device of claim 1 wherein said first MOS transistor is an NMOS transistor.

13. The device of claim 1 wherein said read switch is an NMOS transistor.

14. The device of claim 1 wherein said photoelement is in an array of pixel elements controlled to output signals corresponding to an image incident upon said array, said device comprising said array of photoelements.

15. A method performed by a photoelement in an image sensor comprising:
    generating a current through a photosensitive device related to an amount of light impinging on said photosensitive device;
    closing a reset switch to connect a storage capacitance to a voltage source for charging said storage capacitance in a charging cycle;
    opening said reset switch to disconnect said storage capacitance from said voltage source during a discharging cycle;
    closing a shutter switch to couple said storage capacitance to said photosensitive device during said discharging cycle;
    opening said shutter switch to isolate said storage capacitance during a read cycle;
    applying said storage capacitance to a gate of a first MOS transistor, said first MOS transistor having a first current carrying terminal connected to a first voltage, and having a second current carrying terminal providing a second voltage related to a gate voltage of said first MOS transistor during said read cycle; and
    closing a read switch connected to first MOS transistor to couple a voltage corresponding to said second voltage to an output terminal so as to output, during said read cycle, a voltage relating to light impinging on said photosensitive device during said discharging cycle.

16. The method of claim 15 wherein said storage capacitance is a parasitic capacitance of a conductive line in said photoelement.

17. The method of claim 15 wherein said storage capacitance includes capacitance of one or more FET capacitors.

18. The method of claim 15 wherein said closing said shutter switch is performed during said charging cycle.

19. The method of claim 15 further comprising generating a bias voltage and applying said bias voltage to said photosensitive device.

20. The method of claim 15 further comprising processing said voltage at said output terminal to convert an optical image into electrical signals.

* * * * *